(12) United States Patent
Niessen et al.

(10) Patent No.: US 9,000,292 B2
(45) Date of Patent: Apr. 7, 2015

(54) DEVICE FOR ADAPTABLE WAVELENGTH CONVERSION AND A SOLAR CELL

(75) Inventors: Rogier A. H. Niessen, Eindhoven (NL); Willem F. Pasveer, Eindhoven (NL); Johan H. Klootwijk, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 258 days.

(21) Appl. No.: 13/127,789

(22) PCT Filed: Nov. 10, 2009

(86) PCT No.: PCT/IB2009/054981
§ 371 (c)(1),
(2), (4) Date: May 5, 2011

(87) PCT Pub. No.: WO2010/055463
PCT Pub. Date: May 20, 2010

(65) Prior Publication Data
US 2011/0209756 A1 Sep. 1, 2011

(30) Foreign Application Priority Data
Nov. 13, 2008 (EP) .................................... 08169029

(51) Int. Cl.
G02B 5/24 (2006.01)
G02B 26/00 (2006.01)
H01L 31/0232 (2014.01)
G02F 1/35 (2006.01)
G02F 1/133 (2006.01)

(52) U.S. Cl.
CPC ............... *G02B 5/24* (2013.01); *G02B 26/004* (2013.01); *H01L 31/02322* (2013.01); *G02F 1/353* (2013.01); *G02F 2001/13324* (2013.01)

(58) Field of Classification Search
USPC ......................................................... 136/257
See application file for complete search history.

(56) References Cited

U.S. PATENT DOCUMENTS

| 4,135,537 | A | 1/1979 | Blieden | |
|---|---|---|---|---|
| 4,149,902 | A | 4/1979 | Mauer | |
| 4,270,517 | A | 6/1981 | Stephens | |
| 2005/0100270 | A1 | 5/2005 | O'Connor | |
| 2007/0273265 | A1 | 11/2007 | Hikmet | |
| 2007/0277869 | A1 | 12/2007 | Shan | |
| 2008/0186581 | A1 | 8/2008 | Bita | |
| 2009/0002806 | A1* | 1/2009 | Skipor et al. | 359/296 |
| 2009/0257111 | A1* | 10/2009 | Heikenfeld et al. | 359/295 |

FOREIGN PATENT DOCUMENTS

| EP | 1865562 A2 | 12/2007 |
|---|---|---|
| WO | WO2008024201 A2 | 2/2008 |

* cited by examiner

*Primary Examiner* — Jeffrey T Barton
*Assistant Examiner* — Tae-Sik Kang

(57) ABSTRACT

A device for adaptable wavelength conversion and a device for energy conversion are described. The device for adaptable wavelength conversion comprises at least one layer comprising a wavelength converting material and arranged to receive and re-emit a light beam. The device is further arranged to manipulate the at least one layer to operate in a closed state, in which a surface of the at least one layer is substantially covered with the wavelength converting material and to operate in an open state, in which the surface of the at least one layer is substantially uncovered with the wavelength converting material. The device for adaptable wavelength conversion can be applied in combination with a solar cell or photovoltaic cell thereby enabling the solar cell to receive radiation having a suitable spectrum under varying lighting conditions.

11 Claims, 3 Drawing Sheets

DEVICE FOR ADAPTABLE WAVELENGTH CONVERSION AND A SOLAR CELL

FIELD OF THE INVENTION

The invention relates to the field of photovoltaic cells, and more specifically to the use of wavelength converting materials to improve the performance of photovoltaic cells.

BACKGROUND OF THE INVENTION

At present, photovoltaic cells, also referred to as solar cells, are widely applied to absorb an incoming electromagnetic radiation, e.g. solar radiation, and convert it to electrical energy. Different types of photovoltaic cell designs currently exist which may comprise various light (in general, radiation) absorbing materials such as silicon (mono-crystalline, polycrystalline or amorphous), GaAs, polymers, CdTe, . . . etc., each of the aforementioned materials having a unique absorption characteristic. Currently, most of the world's photovoltaic modules or cells comprise mono or polycrystalline silicon.

In order to operate, a photovoltaic cell requires a certain energy photon to separate an electron-hole pair. For silicon based cells, the required energy is equivalent to near IR (infrared) radiation. Photons having less energy than required, i.e. outside the absorption spectrum, are thus wasted by not being absorbed. Photons having more energy than required may waste the excess portion as heat. As a result, a comparatively large part of incoming radiation may not be used to generate electrical energy. It can further be stipulated that the amount of heat generated in a photovoltaic cell may further deteriorate the performance of the cell.

Different solutions have been devised to convert a larger portion of the incoming radiation spectrum into electrical energy.

As an example, it has been proposed to apply photovoltaic arrays having multiple cells with different required energies, so as to capture more of the solar spectrum efficiently. For such a solution, reference can e.g. be made to WO 2008/024201. WO 2008/024201 discloses the use of a spectral splitting assembly for splitting an incident light into multiple beams of light, each having a different nominal spectral bandwidth. By an appropriate spatial arrangement of multiple solar cells, responsive to the different nominal spectral bandwidth, an improved use of the incident light can be made. The arrangement as disclosed in WO 2008/024201 further describes the use of an optical concentrator for increasing the amount of incident light to the solar cells. A drawback of the arrangement as shown is that it required different types of solar cells, each responsive to a different spectral bandwidth and a spectral splitting assembly, making the arrangement rather expensive.

Similar solar cell arrangements that apply solar cells having different band gaps and dispersive optics capable of directing wavelengths of incoming lights to the most appropriate cell for those wavelengths are also described in US 2007/0277869.

To convert a larger portion of the incoming radiation spectrum into electrical energy it has also been proposed to coat a photovoltaic cell with a light conversion material, which convert an unusable part of the incoming spectrum into the required energy. Reference can e.g. be made to EP 1 865 562 for such an arrangement. A drawback of such a solution is that it provides a permanent conversion and is not adapted to accommodate for varying operating conditions of the solar cell. Such varying operating conditions may occur when solar cells are applied to power mobile devices. In such an application, the radiation spectrum of the incident light may vary, depending on the location (e.g. indoors or outdoors) where the device is used.

It may further be noted that the arrangements proposed in US 2007/0277869 or WO 2008/024201 are not adapted to accommodate for varying operating conditions either.

SUMMARY OF THE INVENTION

It would be desirable to provide a device which facilitates an efficient application of a solar cell or photovoltaic cell under varying conditions. Within the present invention, solar cell or photovoltaic cell is used to refer to devices that can absorb an incoming electromagnetic radiation, e.g. solar radiation, and convert it to electrical energy.

In order to achieve this, in a first aspect of the invention, a device for adaptable wavelength conversion is provided, the device comprising at least one layer comprising a wavelength converting material and arranged to receive and re-emit a light beam, wherein the device is arranged to manipulate the at least one layer to operate in a closed state, in which a surface of the at least one layer is substantially covered with the wavelength converting material and to operate in an open state, in which the surface of the at least one layer is substantially uncovered with the wavelength converting material. In accordance with the present invention, light or a light beam is considered to encompass both electromagnetic radiation within the visible spectrum and electromagnetic radiation outside the visible spectrum.

The device according to the first aspect of the invention enables an adaptable wavelength conversion. In order to achieve this, the device comprises at least one layer comprising a wavelength converting material. Such a layer can e.g. comprise a transparent plate which can be covered by the wavelength converting material. The device is further arranged to manipulate the at least one layer to operate in two distinct states. In a first state (also referred to as the closed state), a surface of the at least one layer is substantially covered with the wavelength converting material. In a second state (also referred to as the open state) the surface of the at least one layer is substantially uncovered with the wavelength converting material. When operating in the first state, a light beam that is received by the layer, can be converted by the wavelength conversion material which covers the surface of the layer. The wavelength conversion material may thus convert the spectrum of the incident light beam and thus result in a modified light beam having a different spectrum. When operating in the second state, an incident light beam having a specific spectrum is virtually not affected by the wavelength conversion material and may thus leave the layer with the same spectrum. The device according to the first aspect of the invention is further arranged to manipulate the layer to operate in either the first or the second state. Various solutions (such as mechanical or electrical) to enable such a transition from operation in the first state to operating in the second state (and vice versa) are described in more detail in the description below. By enabling such a transition from operation in the first state to operating in the second state, the device enables an adaptable conversion of an incident light beam; the spectrum of an incident light beam can either remain unaffected or can be converted. When applied in combination with a photovoltaic cell, the device thus facilitates an efficient application of a solar cell or photovoltaic cell under varying conditions: Depending on the spectrum of the light that is available, it can be decided, for efficiency reasons, to either operate the device in the first state or in the second state.

In an embodiment, the device according to the first aspect of the invention is provided with a plurality of layers whereby each layer can be provided with a different wavelength conversion material. By combining multiple layers, a larger portion of the available spectrum of an incident light beam can be converted to a wavelength most suited for operating a photovoltaic cell.

According to a second aspect of the invention, there is provided a device for energy conversion comprising a device for adaptable wavelength conversion according to the first aspect of the invention and a solar cell, wherein the solar cell is arranged to receive a re-emitted light (in general, electromagnetic radiation) beam of the device for adaptable wavelength conversion and to convert, in use, the received light beam, at least partially, into electrical energy. The device for energy conversion according to the second aspect of the invention enables an efficient energy conversion under varying conditions. The device for energy conversion according to the second aspect of the invention can e.g. be applied in an environment where the available electromagnetic radiation is predominantly ineffective for conversion by the solar cell. In such an environment (e.g. indoors), the device for adaptable wavelength conversion of the device for energy conversion can be arranged to operate in the first state, thereby converting the incident electromagnetic radiation to a wavelength more suited for operating the solar cell.

In an embodiment, the device for energy conversion further comprises a light sensor for determining a frequency property of the incident light beam, such as a main frequency, or the spectrum of the incident radiation. A control unit of the embodiment may be arranged to control the device for adaptable wavelength conversion in accordance with a signal provided by the light sensor. As such, an automatic adaptation to varying environmental conditions (i.e. varying lighting conditions) can be realized. Based on a signal received from the light sensor, the control unit (which can e.g. comprise a microprocessor or the like), can determine the most suitable state of the device for adaptable wavelength conversion and control the device for adaptable wavelength conversion to operate in this state.

These and other aspects of the invention will be more readily appreciated as the same becomes better understood by reference to the following detailed description and considered in connection with the accompanying drawings in which like reference symbols designate like parts.

BRIEF DESCRIPTION OF THE DRAWINGS

Further advantageous embodiments of the assembly according to the invention are described in the claims and in the following description with reference to the drawing, in which:

DETAILED DESCRIPTION OF EXAMPLES

Figure 1:
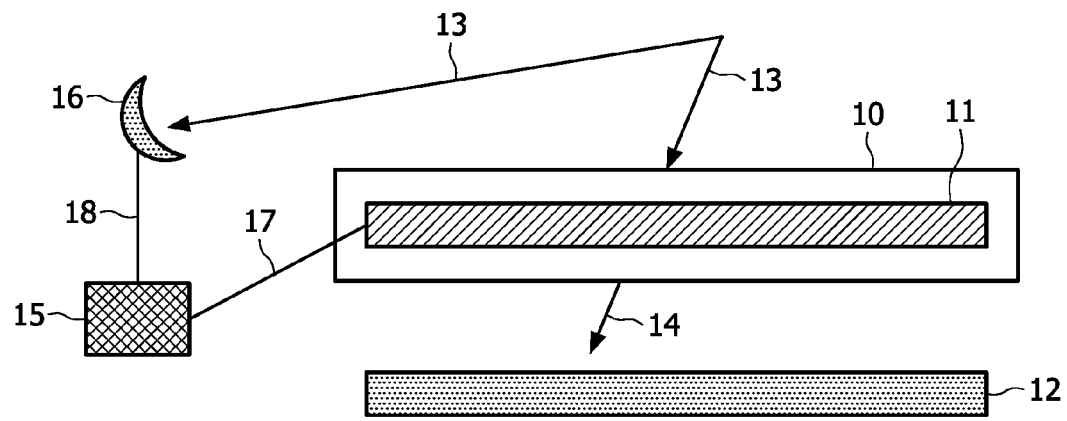
FIG. 1 shows a cross-section of a first embodiment of a device for energy conversion according to the invention.

In FIG. 1 a first embodiment of a device for energy conversion according to the present invention is depicted. The device comprises a device for adaptable wavelength conversion 10 and a solar cell 12. The device for adaptable wavelength conversion 10 comprises a layer 11 which comprises a wavelength conversion material. The layer 11 is arranged to receive a first light beam indicated by arrow 13. The layer 11 comprises a wavelength conversion material and can be operated in a first (closed) state and a second (open) state. In the closed state, the layer 11 is arranged to absorb an amount of energy of the first light beam 13 with a first specific spectrum of wavelengths and to re-emit at least partially the amount of energy as a second light beam, indicated by arrow 14, with a second, different from the first, specific spectrum of wavelengths. In an open state, the light beam 13 passes through the layer 11 substantially without a wavelength conversion. The device for adaptable wavelength conversion 10 is further arranged to manipulate the layer 11 to operate either in the first state or the second state. Various options how to realize such a transition are discussed below.

In the embodiment of FIG. 1 the solar cell 12 is arranged to receive the light beam 14 when the layer 11 is operated in the closed state and is arranged to receive the light beam 13 when the layer 11 is operated in the open state. The solar cell 12 is arranged to converse the energy of the received light beam 13 or 14 into electrical energy. The solar cell 12 can e.g. be a silicon-based photo voltaic cell. The co-operation between the layer 11 and the solar cell as described above enables the solar cell to provide a more efficient energy conversion of an incoming light beam 13 of the device: Since the solar cell 12, in general, has a specific wavelength range in which its photosensitivity peaks, it may be advantageous to convert energy of the first light beam 13 with wavelengths outside the specific wavelength range into energy of the second light beam 14 with wavelengths inside the specific wavelength range.

For example, when the first light beam 13 comprises a light beam emitted by a lamp and the solar cell 12 has its photosensitivity peak within an infrared or near infrared wavelength range (as can be in case of a silicon-based solar cell), it can advantageous to use a wavelength converting material such as a rare earth phosphor activated with europium or praseodymium (such as $Y_2O_3:Eu^{3+}$ and $Y_2O_3:Pr^{3+}$). These materials have a peak emission wave length in the range 600-630 nm. Therefore, if the light beam emitted by a lamp is passed though this material, the solar cell will be able to convert more energy of the light beam to electrical energy. In this manner the efficiency of the solar cell can be improved.

Other examples of wavelength conversion material are photochromic materials such as 1,3,3,3-trimethylindolinobenzospiropyran, 1,3,3-trimethylspiroindolinonaphthoxazine, rhodamine B, which absorbs blue light and emits red, rhodamine 6G, which absorbs green light and emits red and perylene dyes.

Optionally, a control unit 15 and a spectrum detector 16 (in general, a light sensor) can be provided to control the device for adaptable wavelength conversion 10. Based on a control signal 17 from the control unit 15, the device for adaptable wavelength conversion 10 can manipulate the layer 11 to operate in either the open or the closed state. The control unit 15 and the spectrum detector 16 are schematically depicted in FIG. 1. The control unit 15 is arranged to process a signal 18 from the spectrum detector 16 and to assess whether layer 11 is to be operated in an open or a closed state. In order to provide the signal 18, the spectrum detector 16 can be arranged to receive a comparatively small part of the light beam 13, to determine a frequency property of the specific spectrum of the light beam 13. In general, the spectrum detector or light sensor 16 is arranged to provide a signal comprising information about the specific spectrum of the light beam 13 to the control unit 15. Alternatively, the layer 11 can be manipulated to be operated in an open and a closed state by a user action, e.g. by operating a mechanical switch or selector provided on the device 10.

It can be understood that the control unit 15 may control the device for adaptable wavelength conversion to operate the layer 11 in the closed state if a relatively large amount of energy in the specific spectrum is located outside of the specific wavelength range of the solar cell and if the wavelength conversion material is arranged for converting this energy into energy of the second light beam with wavelengths inside the specific wavelength range of the solar cell.

Figure 2A:
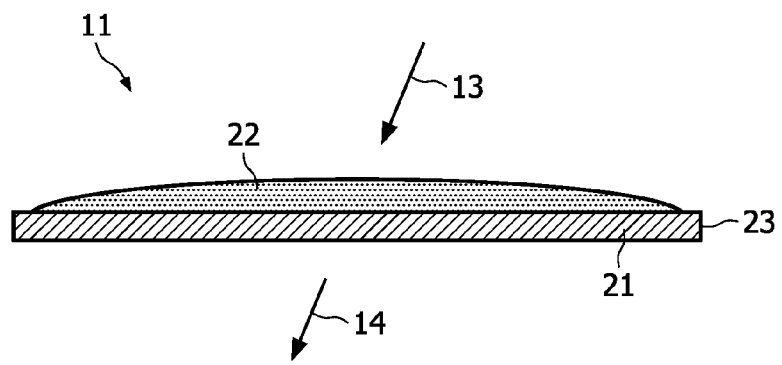
FIGS. 2A-2B show a cross-section of a device for adaptable wavelength conversion in a closed state and an open state.
Figure 2B:
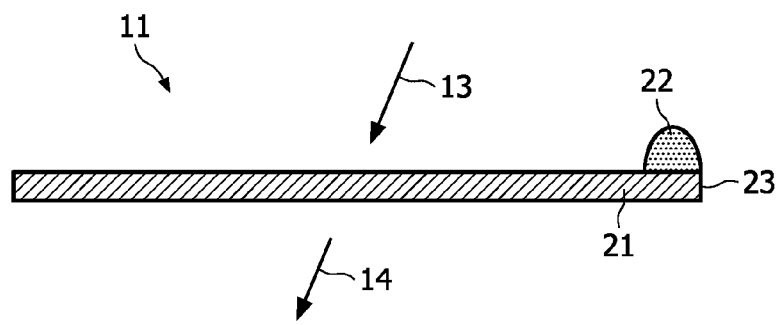

In FIG. 2 a further embodiment of the layer 11 as can be applied in a device for adaptable wavelength conversion according to the present invention is shown. FIG. 2A shows the layer 11 in a closed state, FIG. 2B shows the layer in an open state. The layer 11 comprises a substrate 21 and a liquid 22 containing the wavelength conversion material. In the closed state, the liquid 22 is arranged to substantially cover a surface 23 of the substrate 21, in the open state the liquid is arranged to substantially uncover the surface 23 of the substrate 21. In the closed state, a light beam 13 incident to the layer 11 is received by the liquid 22 which comprises the wavelength conversion material. When the incident light beam 13 passes through the liquid comprising the wavelength conversion material, a light beam 14 is re-emitted by the wavelength conversion material. The light beam 14 may further pass through the transparent substrate 21. In the open state, shown in FIG. 2B, the light beam 13 can pass through the transparent substrate 21, substantially without being received by the liquid 22, thereby leaving the first spectrum of light beam 13 substantially unaltered.

Figure 3A:
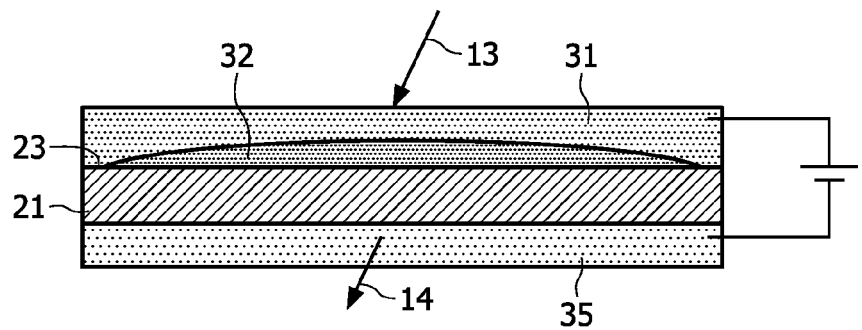
FIGS. 3A-3B show a cross-section of a further embodiment of a device for adaptable wavelength conversion in a closed state and an open state.
Figure 3B:
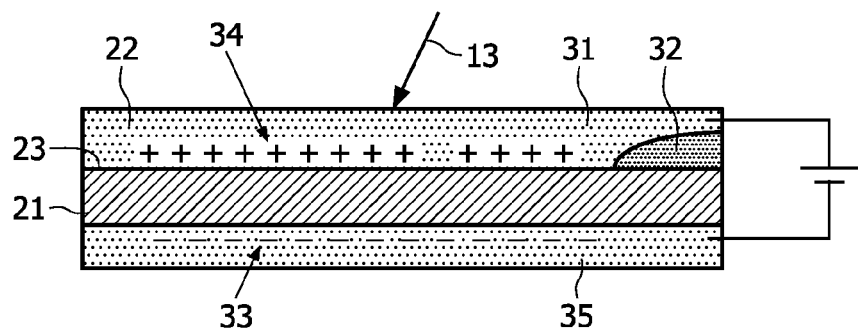

In FIG. 3 a further embodiment of the device for adaptable wavelength conversion according to the present invention is shown. FIG. 3A shows the device in a closed state is shown and FIG. 3B shows it in an open state. In the embodiment as shown, the device comprises a layer which comprises a liquid and a substrate 21. The liquid of the embodiment as shown comprises a water-based solution 31 and an oil-based solution 32, whereby the wavelength converting material is dissolved in the oil-based solution. The substrate 21 as shown in the embodiment comprises a hydrophobic insulator, for example a fluoropolymeric layer. The embodiment further comprises an electrode 35 arranged to apply a voltage across the hydrophobic insulator 21 between the electrode 35 and the water-based solution 31, whereby a positive charge 34 is formed in the water-based solution 31 and a negative charge 33 is formed in the electrode 35. When the voltage is applied as indicated in FIG. 3B, the water-based solution 31 can displace the oil-based solution 32 to a corner of the surface 23 of the hydrophobic insulator 21. When operating in this state (also referred to as the open state), a light beam 13 incident to the layer may pass the layer substantially unaffected by the wavelength converting material comprised in the oil-based solution 32. When no voltage is applied (corresponding to the state as depicted in FIG. 3A), the oil-based solution 32 may substantially cover the surface 23 of the hydrophobic insulator 21. When operating in this state (also referred to as the closed state), a light beam 13 incident to the layer may be converted to a light beam 14 by the wavelength converting material comprised in the oil-based solution 32.

Figure 4A:
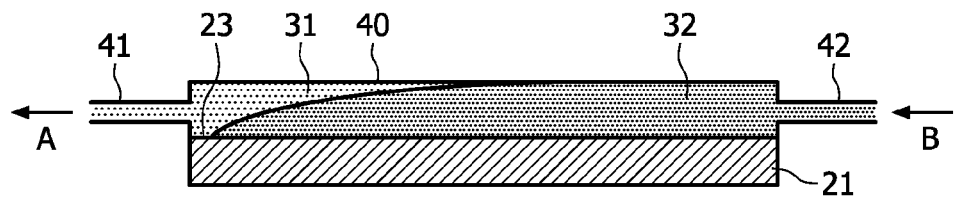
FIGS. 4A-4B show a cross-section of another embodiment of a device for adaptable wavelength conversion in a closed state and an open state.
Figure 4B:
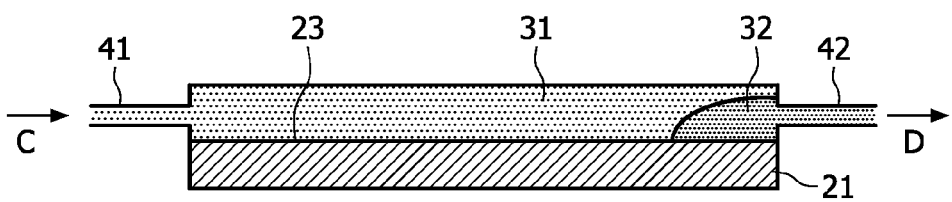

In FIG. 4 another embodiment of the device for adaptable wavelength conversion according to the present invention is shown. The device comprises a layer comprising a liquid and a substrate 21, the liquid comprising an oil-based solution 32 comprising a wavelength converting material and a water-based solution 31 which can be contained in a volume 40. In the embodiment as shown, the volume 40 comprises an inlet tube 42 and an outlet tube 41 enabling a displacement of the liquid contained in the volume. The device is operable in either an open state and a closed state, similar to the embodiments as shown in FIGS. 2A-2B and FIGS. 3A-3B. In FIG. 4*a* the device is shown changing from the open state to the closed state. During this transition, the oil-based solution 32 flows through inlet tube 42 in the direction indicated by arrow B. At the same time, the water-based solution 31 flows through outlet tube 41 in the direction indicated by arrow A. In order to cause the solutions to flow a pump (not shown) can be provided between tubes 42 and 41. When the oil-based solution 32 substantially covers the surface 23 of substrate 21, the device is said to be in the closed state. In FIG. 4B the device is shown changing from the closed state to the open state. During this, the oil-based solution 32 flows through inlet tube 42 in the direction indicated by arrow D. At the same time, the water-based solution 31 flows through out let tube 41 in the direction indicated by arrow C. When the oil-based solution 32 has substantially uncovered the surface 23 of substrate 21, the device is said to be in the closed state.

Figure 5:
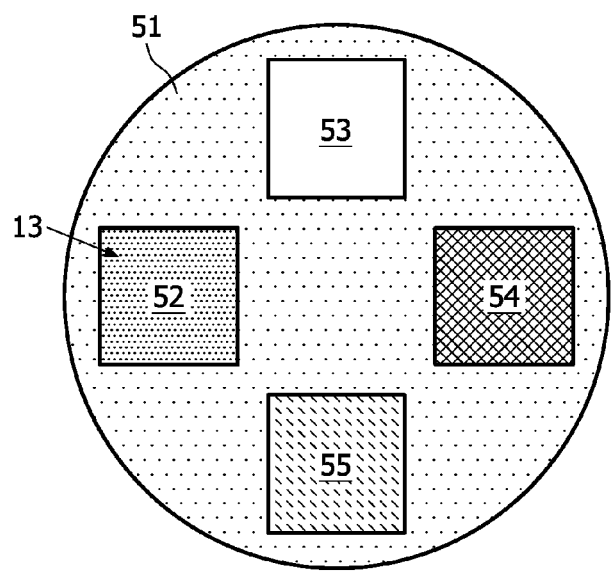
FIG. 5 shows a cross-section of another embodiment of a device for adaptable wavelength conversion.

Yet another embodiment of the device for adaptable wavelength conversion according to the present invention is shown in FIG. 5. In this embodiment a disc 51 is provided with 4 transparent windows 52, 53, 54, 55. Each of these windows can be covered with a wavelength conversion material or it can be left transparent. In the embodiment of FIG. 5 window 53 is uncovered. The disc 51 is arranged to receive a light beam substantially perpendicular to the disc 51 at a specific area on the disc 51, the specific area can e.g. be located where window 52 is shown in FIG. 5. The disc 51 is arranged to rotate about its own axis perpendicular to the disc. When the disc is rotated about 90 degrees, another window will be positioned to receive the light beam. By rotating the disc 90, 180 or 270 degrees, different windows are selected to receive the light beam. When window 53 or another window uncovered by a wavelength conversion material, is positioned to receive the light beam the device is said to be in the open state. When windows 52, 54, or 55 or another windows covered by a wavelength conversion material, is positioned to receive the light beam the device is said to be in the closed state. It can be understood from the above that other embodiments can contain any number of windows.

It can also be seen that two different windows can be covered by different wavelength conversion materials.

Figure 6A:
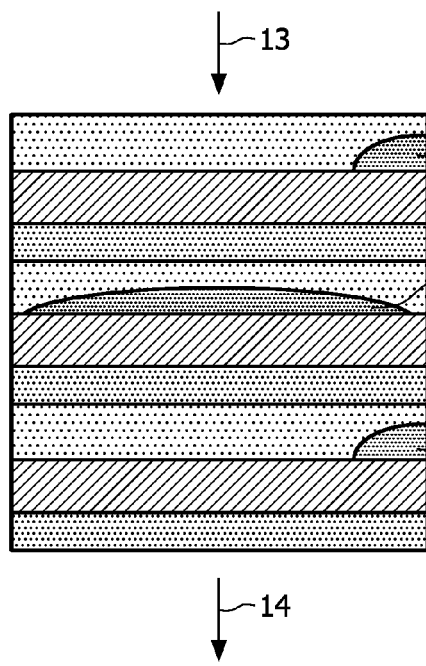
FIGS. 6A-B show a cross-section of another embodiment of a device for adaptable wavelength conversion in two different closed states.
Figure 6B:
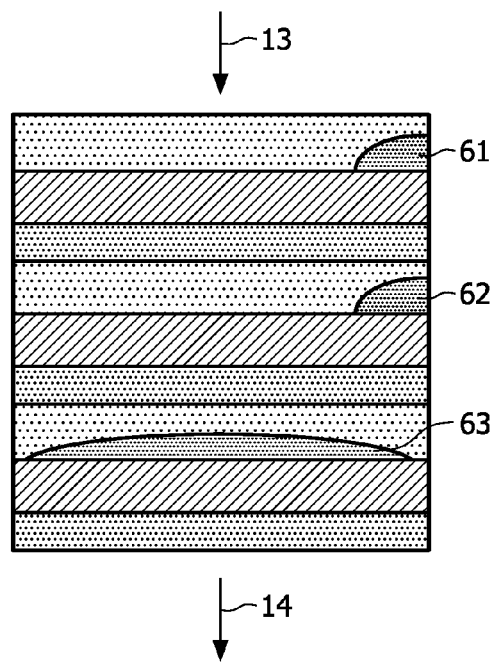

In FIGS. 6A-6B a further embodiment of the device for adaptable wavelength conversion according to the present invention is shown. In this embodiment several layers as shown in FIGS. 3A-3B have been stacked. Each layer may comprise a different wavelength conversion material, 61, 62, and 63, e.g. comprised in an oil-based solution. FIGS. 6A and 6B show the device in two different states. In FIG. 6A the layer comprising wavelength conversion material 61 is arranged to receive light beam 13 and to re-emit light beam 14. In FIG. 6B the layer 11 comprising wavelength conversion material 63 is arranged to receive light beam 13 and to re-emit light beam 14.

It can be understood from FIGS. 5 and 6 that the layer selected to receive a light beam may be adapted to the spectrum of the light beam. It can be advantageous to select a layer, of which its wavelength conversion material converts a comparatively large amount of energy of the light beam to operate in a closed state while operating other layers in an open state.

It can be understood that the embodiments of the device for adaptable wavelength conversion according to the present invention as shown in FIGS. 3, 4, 5, and 6 may be combined with a solar cell in order to obtain a device for energy conversion according to the invention. Such embodiments of a device for energy conversion may further comprise a control unit and a spectrum detector as e.g. described in FIG. 1. For example, in a further embodiment of the embodiment depicted in FIG. 5, a control unit can be arranged to determine which window is to be positioned to receive the light beam.

When a solar cell is provided to receive a light beam re-emitted from a device for adaptable wavelength conversion as e.g. shown in FIGS. 3, 4, 5, and 6, the efficiency of the solar cell can be optimized by an appropriate conversion of the spectrum of an incident light beam depending on the lighting conditions experienced. For example, for indoor applications, the spectrum of an incident light beam may vary, as the source the light beam may be the sun, a neon lamp, a LED light, etc. The present invention may equally be applied to accommodate for varying outdoor lighting conditions. Such varying conditions can e.g. be encountered due to a different location (the spectrum of light as received on the North pole can e.g. be different from the spectrum as received near the Equator), a different time of day (comparing the spectrum of light as received in the morning or the evening), or different weather conditions (comparing the spectrum of light received on a clear day or on a clouded day). The device for energy conversion according to the present invention can thus be applied to ensure a preferred conversion of the incoming spectrum of light (by a selection of the appropriate layer or layers to operate in the closed or open state) to a spectrum more suited for the solar cell depending on varying lighting conditions, either indoor or outdoor.

Since the surface of the layer as applied can be small (typically a few square centimeters) compared to a surface of a solar cell (which can e.g. be a few square decimeters), it can be understood from the above, that another embodiment of the invention comprises several layers or stacks of layers positioned adjacent to each other to cover the surface of the solar cell.

By the present invention, a device for adaptable wavelength conversion and a device for energy conversion are described. The device for adaptable wavelength conversion comprises at least one layer comprising a wavelength converting material and arranged to receive and re-emit a light beam, the device is further arranged to manipulate the at least one layer to operate in a closed state, in which a surface of the at least one layer is substantially covered with the wavelength converting material and to operate in an open state, in which the surface of the at least one layer is substantially uncovered with the wavelength converting material. The device for adaptable wavelength conversion can be applied in combination with a solar cell or photovoltaic cell thereby enabling the solar cell to receive radiation having a suitable spectrum under varying lighting conditions.

As required, detailed embodiments of the present invention have been disclosed; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting, but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language, not excluding other elements or steps). Any reference signs in the claims should not be construed as limiting the scope of the claims or the invention.

The mere fact that certain measures are recited in mutually different dependent claims does not indicate that a combination of these measures cannot be used to advantage.

The invention claimed is:

1. A device for energy conversion, comprising:
a device for adaptable wavelength conversion comprising at least one layer comprising a wavelength converting material and arranged to receive a first electromagnetic radiation, within and outside the visible spectrum, and re-emit a second electromagnetic radiation, wherein the device is arranged to manipulate the at least one layer to operate in a closed state, in which a surface of the at least one layer is substantially covered with the wavelength converting material and to operate in an open state, in which the surface of the at least one layer is substantially uncovered with the wavelength converting material;
a solar cell configured to receive the second electromagnetic radiation;
a control unit; and
a spectrum detector, the spectrum detector configured to determine a frequency property of the first electromagnetic radiation and provide a signal including information about a specific spectrum of the first electromagnetic radiation to the control unit, and the control unit configured to control the device for adaptable wavelength conversion to switch between operating in the closed state and operating in the open state based on the signal.

2. The device according to claim 1, wherein the wavelength converting material is arranged to absorb an amount of energy of the first electromagnetic radiation with a first specific spectrum of wavelengths and to re-emit at least partially the amount of energy as the second electromagnetic radiation with a second, different from the first, specific spectrum of wavelengths.

3. The device according to claim 2, wherein the first specific spectrum of wavelengths comprises a spectrum of wavelengths of a light beam emitted by a lamp.

4. The device according to claim 2, wherein the second specific spectrum of wavelengths comprises substantially infrared or near infrared.

5. The device according to claim 1, wherein the at least one layer further comprises a liquid comprising the wavelength converting material, whereby the liquid comprising the wavelength converting material is arranged to substantially cover the surface of the layer in the closed state and to substantially uncover the surface of the layer in the open state.

6. The device according to claim 5, whereby the liquid comprising the wavelength converting material further comprises a water-based solution and an oil-based solution, whereby the wavelength converting material is dissolved in the oil-based solution.

7. The device according to claim 5, wherein the at least one layer further comprises a first transparent substrate for providing the surface.

8. The device according to claim 7 wherein the at least one layer comprises a second transparent substrate arranged in parallel to the first transparent substrate, the liquid comprising the wavelength converting material being provided between the first and second transparent substrates.

9. The device according to claim 7 wherein the first transparent substrate comprises a hydrophobic insulator, the device further comprising an electrode arranged to, in use, apply a voltage across the hydrophobic insulator between the electrode and the liquid.

10. The device according to claim 1 comprising two or more layers, the layers being positioned adjacent to each other.

11. The device according to claim 10 wherein the layers are arranged adjacent to each other in a direction substantially perpendicular to the surface.

* * * * *